United States Patent
Nadimpalli

(10) Patent No.: US 8,878,576 B2
(45) Date of Patent: Nov. 4, 2014

(54) LOW CURRENT, HIGH ACCURACY POWER-ON-RESET

(75) Inventor: Praveen V. Nadimpalli, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/553,930

(22) Filed: Jul. 20, 2012

(65) Prior Publication Data

US 2013/0021071 A1     Jan. 24, 2013

Related U.S. Application Data

(60) Provisional application No. 61/509,732, filed on Jul. 20, 2011.

(51) Int. Cl.
*H03L 7/00* (2006.01)
*H03K 17/22* (2006.01)
*H03K 17/30* (2006.01)

(52) U.S. Cl.
CPC ............ *H03K 17/223* (2013.01); *H03K 17/302* (2013.01)
USPC .......................................................... 327/143

(58) Field of Classification Search
CPC .................................................... H03K 17/223
USPC ........................................................... 327/143
See application file for complete search history.

(56) References Cited

U.S. PATENT DOCUMENTS

| | | | |
|---|---|---|---|
| 6,307,480 B1 * | 10/2001 | Sheldon et al. | 340/636.1 |
| 6,469,552 B2 | 10/2002 | Ohbayashi et al. | |
| 6,556,058 B2 | 4/2003 | Ohbayashi et al. | |
| 7,019,417 B2 | 3/2006 | Kang | |
| 2008/0225566 A1 * | 9/2008 | Beattie et al. | 365/96 |

\* cited by examiner

*Primary Examiner* — Daniel Rojas
(74) *Attorney, Agent, or Firm* — Withrow & Terranova, P.L.L.C.

(57) ABSTRACT

The present disclosure relates generally to power-on-reset (POR) devices for activation of a circuit block powered by a battery. The POR devices activate a circuit block when a battery voltage level of a battery voltage generated by the battery is above a dead battery condition voltage level. So that the circuit block is activated after the battery voltage level of the battery voltage has reached the dead battery condition voltage level, the POR device includes a trigger circuit. The trigger circuit is operable to receive the battery voltage and is configured to generate a trigger signal in response to the battery voltage level being charged above a trigger voltage level, which is equal to or greater than the dead battery condition voltage level. The POR circuit is also operable to generate a POR signal in an activation state and activate the circuit block.

25 Claims, 5 Drawing Sheets

LOW CURRENT, HIGH ACCURACY POWER-ON-RESET

RELATED APPLICATIONS

This application claims the benefit of provisional patent application Ser. No. 61/509,732, filed Jul. 20, 2011, the disclosure of which is hereby incorporated herein by reference in its entirety.

FIELD OF THE DISCLOSURE

This disclosure relates generally to power-on-reset (POR) devices for consumer electronic products.

BACKGROUND

Consumer electronic products are often powered by batteries, which allow these products to be mobile because they do not require connection to a power socket for use. However, this mobility requires that the batteries for these products be periodically recharged. When there is prolonged use of the consumer electronic product without the charging of the battery, the battery may reach a dead battery condition voltage level. Thus, to continue use of the consumer electronic product, the battery requires charging above the dead battery condition voltage level.

For example, if the consumer electronic product uses lithium-ion batteries, a trickle current is used to charge the battery until the battery reaches or is charged above the dead battery condition voltage level. However, when a circuit block powered by the battery in the consumer electronic product is activated prior to the battery being charged above the dead battery condition voltage level, the circuit block may draw excessive current and the battery may not get charged. In other words, the circuit block may hog the current and thereby prevent the battery from being charged above the dead battery condition voltage level. This is typically the case with consumer electronic products that utilize eFuses and eFuse sense circuits, which are often turned on by power-on-reset (POR) devices before the dead battery condition voltage level is reached by the battery.

Therefore, what is needed is a POR device that prevents circuit blocks from becoming activated until after the battery has been charged above the dead battery condition voltage level.

SUMMARY

The present disclosure relates generally to power-on-reset (POR) devices for activation of a circuit block powered by a battery. In particular, the POR devices disclosed herein are configured to activate a circuit block when a battery voltage level of a battery voltage generated by the battery has been charged above a dead battery condition voltage level. The circuit block may be any type of circuit block used in a consumer electronic product, such as a cellular phone, a laptop, a tablet, and/or the like.

To prevent the circuit block from being activated until after the battery voltage level of the battery voltage has reached the dead battery condition voltage level, the POR device includes a trigger circuit. The trigger circuit is operable to receive the battery voltage and is configured to generate a trigger signal in response to the battery voltage level being charged above a trigger voltage level. The trigger voltage level is equal to or greater than the dead battery condition voltage level. As such, the trigger signal is not generated until after the battery voltage level has reached the dead battery condition voltage level. A POR circuit is operable to receive the trigger signal from the trigger circuit. The POR circuit is also operable to generate a POR signal in either a deactivation state or an activation state. Prior to receiving the trigger signal, the POR circuit generates the POR signal in the deactivation state. However, in response to receiving the trigger signal, the POR circuit is configured to switch the POR signal from the deactivation state to the activation state. The POR signal may be received by the circuit block and in response to the POR signal being in the activation state, the circuit block may be activated. Since the circuit block does not receive the trigger signal in the activation state until after the battery voltage level has reached the dead battery condition voltage level, the POR device helps ensure that the circuit block is not activated until after the battery has been appropriately charged.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Power-on-reset (POR) devices are often utilized in different types of consumer electronic products, such as, cell phones, laptops, desktop computers, and/or the like, to activate a circuit block once a desired power level is reached. For example, POR devices may be utilized to activate a microprocessor, a digital signal processor, a front end radio frequency (RF) circuit, eFuses, eFuse sense circuits, a memory device, and/or the like. These consumer electronic products and the circuit blocks that make up the consumer electronic products are often powered by a battery in order to allow for mobility of the consumer electronic product.

However, power stored in a battery becomes depleted after a certain run time of the consumer electronic product. Sometimes the battery voltage level becomes sufficiently depleted so as to drop below a dead battery condition voltage level. For example, the dead battery condition voltage level of a lithium-ion battery is around 1.5 volts. If the battery voltage level of the battery voltage is below 1.5 volts, the battery is considered dead and needs to be recharged prior to the activation of the circuit blocks provided in the consumer electronic product. Many types of circuit blocks however often draw current, and thus prevent the battery from being charged. The POR devices disclosed herein are designed to ensure that one or more circuit blocks are not activated until after the battery voltage level has been charged above the dead battery condition voltage level.

Figure 1:
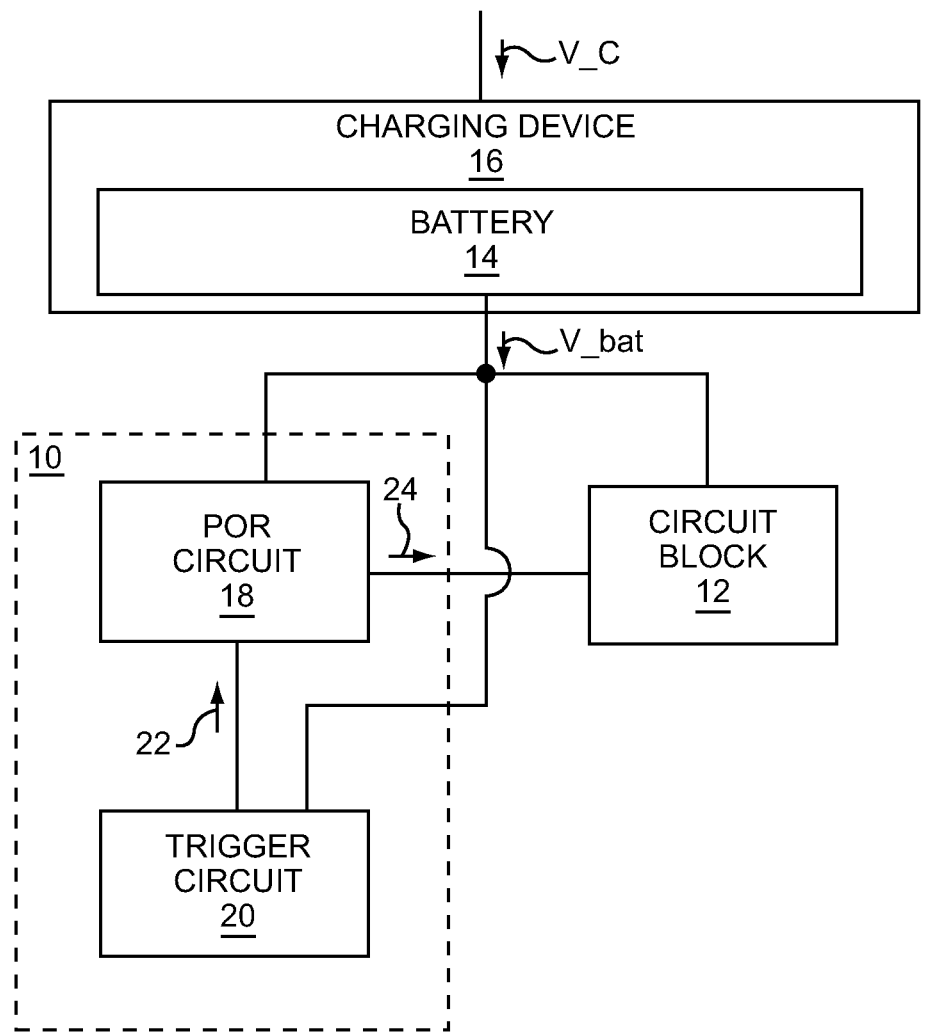
FIG. 1 illustrates a block diagram of one embodiment of a power-on-reset (POR) device used to activate a circuit block powered by a battery in a consumer electronic product.

FIG. 1 illustrates a block diagram of one embodiment of a POR device 10 for activation of a circuit block 12. The circuit block 12 is powered by a battery 14, which generates a battery voltage V_bat. The battery 14 is being charged by a charging device 16. To charge the battery 14, the charging device 16 receives a charging voltage V_C. The electromagnetic energy provided by the charging voltage V_C is converted into chemical energy which is stored by the battery 14. The charging voltage V_C may be received from a power source and/or power conversion circuitry configured to condition the charging voltage V_C in accordance with the input requirements of the charging device 16. The chemical energy stored by the battery 14 is then converted into electromagnetic energy by the battery 14, which generates the battery voltage V_bat that powers the components of the consumer electronic product, such as the circuit block 12. When the battery voltage level of the battery voltage V_bat is below a dead battery condition voltage level, the battery 14 is considered to be dead. As such, the circuit block 12 should not be activated until after the battery voltage level of the battery voltage V_bat generated by the battery 14 is charged above the dead battery condition voltage level.

For example, in one embodiment, the battery 14 that powers the circuit block 12 is a lithium-ion battery and the charging device 16 is configured to charge this lithium-ion battery. When the battery voltage level of the battery voltage V_bat is below the dead battery condition voltage level (approximately 1.5 volts), the lithium-ion battery is provided with a trickle current. The trickle current is provided until the lithium-ion battery is charged by the charging device 16 above the dead battery condition voltage level. However, if the circuit block 12 were activated before the battery 14 is charged above the dead battery condition voltage level, the circuit block 12 would draw too much current and the trickle current would not be provided to the battery 14. As such, the battery 14 may never be charged. To prevent this from occurring, the POR device 10 is configured to activate the circuit block 12 after the battery voltage level has been charged above the dead battery condition voltage level.

The POR device 10 shown in FIG. 1 includes a POR circuit 18 and a trigger circuit 20. The trigger circuit 20 is operable to receive the battery voltage V_bat and is configured to generate a trigger signal 22 in response to the battery voltage level being charged above a trigger voltage level. This trigger voltage level is equal to or greater than the dead battery condition voltage level and thus, the trigger signal 22 is not generated by the trigger circuit 20 until after the battery voltage level of the battery voltage V_bat is charged above the dead battery condition voltage level. At what level the trigger voltage level may be set depends on the particular application for the POR device 10 and the amount of error tolerance that is permitted by a particular application. For example, if there is a low error tolerance, the trigger voltage level should be set higher so as to ensure that neither electromagnetic operational anomalies nor manufacturing anomalies result in the trigger circuit 20 generating the trigger signal 22 too early. On the other hand, if there is a high error tolerance, the trigger voltage level may be set closer to the dead battery condition voltage level since electromagnetic operational anomalies and manufacturing anomalies may be less of a concern. In this embodiment, the trigger circuit 20 is configured to continuously generate the trigger signal 22 so long as the battery voltage level of the battery voltage V_bat remains above the trigger voltage level. However, in other embodiments, the trigger signal 22 may be generated in response to the battery voltage level being charged above the trigger voltage level for a limited duration. For example, the trigger signal 22 may be a pulse or some other type of temporary electromagnetic excitation.

The POR circuit 18 is operable to generate a POR signal 24 in a deactivation state and in an activation state. As shown in FIG. 1, the POR circuit 18 is coupled to the circuit block 12 so that the circuit block 12 receives the POR signal 24. When the POR circuit 18 generates the POR signal 24 in the deactivation state, the POR signal 24 is configured to deactivate the circuit block 12. In contrast, when the POR circuit 18 generates the POR signal 24 in the activation state, the POR signal 24 is configured to activate the circuit block 12. For example, the POR signal 24 may be in the activation state by having a voltage level greater than an activation voltage level that activates the circuit block 12. Alternatively, the POR signal 24 may be in the activation state by having a current level that is greater than an activation current level that activates the circuit block 12. Accordingly, the POR signal 24 may be in the deactivation state when the POR signal 24 is below the activation voltage level or the activation current level.

When the battery voltage level of the battery voltage V_bat is generated below the dead battery condition voltage level, the POR circuit 18 generates the POR signal 24 in the deactivation state. The POR circuit 18 is operable to receive the trigger signal 22 from the trigger circuit 20. As discussed above, the trigger signal 22 is generated by the trigger circuit 20 in response to the battery voltage level being charged above the trigger voltage level, which is equal to or greater than the dead battery condition voltage level. Thus, the trigger signal 22 is generated once the battery voltage level of the battery voltage V_bat has been charged above the dead battery condition voltage level. The POR circuit 18 is configured to switch the POR signal 24 from the deactivation state to the activation state in response to receiving the trigger signal 22. Accordingly, the circuit block 12 remains deactivated until the battery voltage level of the battery voltage V_bat is above the dead battery condition voltage level, wherein the POR circuit 18 switches the POR signal 24 from the deactivation state to the activation state.

Figure 2:
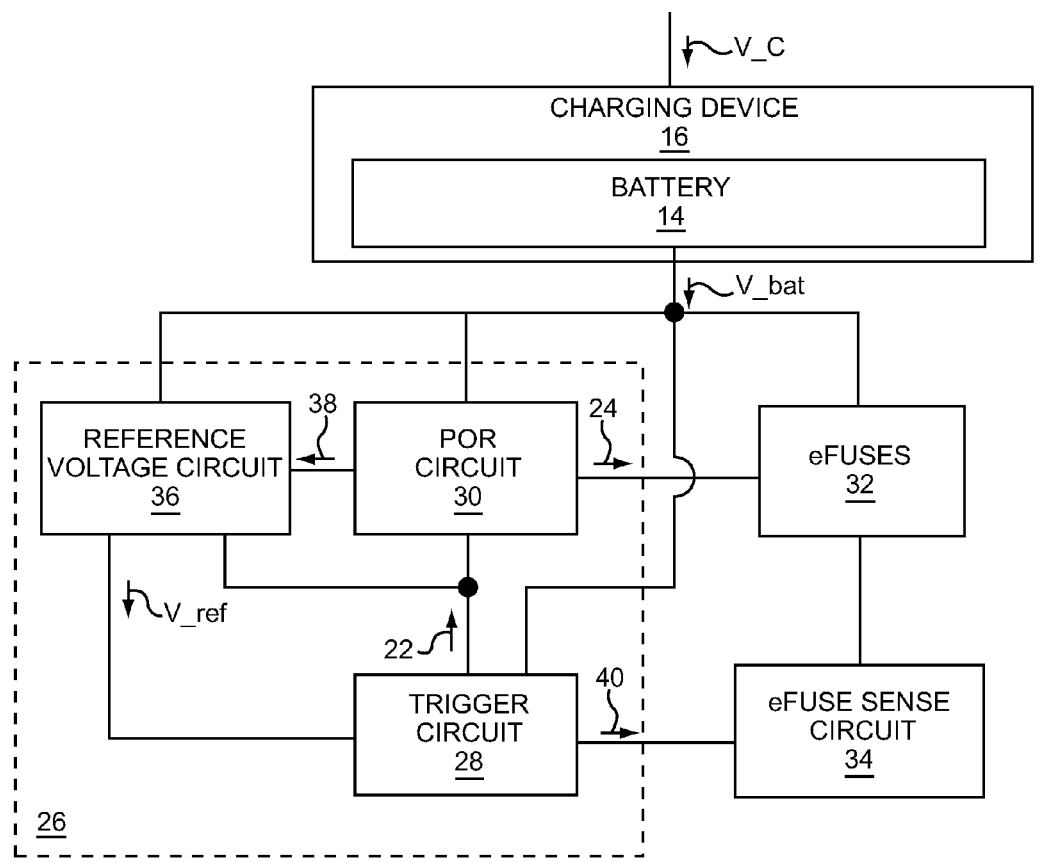
FIG. 2 illustrates a block diagram of another embodiment of a POR device used to activate eFuses powered by a battery in a consumer electronic product.

FIG. 2 illustrates another embodiment of a POR device 26. As in the previous embodiment, a trigger circuit 28 is operable to receive the battery voltage V_bat and is configured to generate the trigger signal 22 in response to the battery voltage level being charged above the trigger voltage level. Again, the trigger voltage level is equal to or greater than the dead battery condition voltage level of the battery 14. Also, as in the previous embodiment, a POR circuit 30 is operable to receive the trigger signal 22. The POR circuit 30 may generate the POR signal 24 in the deactivation state and in the activation state. Prior to the POR circuit 30 receiving the trigger signal 22, the POR circuit 30 generates the POR signal 24 in the deactivation state. In response to receiving the trigger signal 22, the POR circuit 30 is configured to switch the POR signal 24 from the deactivation state to the activation state. In this embodiment, the circuit block 12 of FIG. 1 may have one or more eFuses 32. The eFuses 32 are activated when the POR signal 24 from the POR circuit 30 is in the activation state and are configured to latch various voltage levels that represent parameter values which may be utilized by other circuit blocks, such as a microprocessor, memory, front end RF circuitry, and/or the like. Due to the amount of current that the eFuses 32 draw upon activation, the eFuses 32 should not be activated until the battery 14 has a battery voltage level above the dead battery condition voltage level. To determine the voltage levels that are to be latched by the eFuses 32, an eFuse sense circuit 34 is used to sense the current levels thereby determining the voltage levels to be latched. However, the eFuse sense circuit 34 may draw up to 50 milliamps of current during this process. While the battery voltage level is below the dead battery condition voltage level, this 50 milliamps of drawn current may be significantly greater than the trickle current provided by the charging device 16 to the battery 14. As such, the eFuse sense circuit 34 should also not be activated until the battery voltage level of the battery voltage V_bat is above the dead battery condition voltage level. It should be noted that the POR circuit 30 may be provided as an integrated circuit on one or more semiconductor substrates. The eFuses 32 and the eFuse sense circuit 34 may also be provided as integrated circuits on the same semiconductor substrate(s) as the POR device 26 may be provided on separate semiconductor substrates.

Due to manufacturing anomalies in the fabrication of integrated circuits, setting the trigger voltage level consistently throughout a population of POR devices 26 can be challenging. To reduce variations in the trigger voltage level, the POR device 26 includes a reference voltage circuit 36. In this embodiment, the reference voltage circuit 36 is operable to be enabled and disabled, allowing the POR device 26 to be more power efficient. More specifically, when the reference voltage circuit 36 is enabled, the reference voltage circuit 36 is configured to generate a reference voltage V_ref having a reference voltage level. When disabled, the reference voltage circuit 36 does not generate the reference voltage V_ref. Accordingly, the reference voltage circuit 36 can be controlled so that the reference voltage V_ref is only generated when needed and thereby the POR device 26 saves power.

In this embodiment, the POR circuit 30 is further configured to receive the battery voltage V_bat and enable the reference voltage circuit 36 once the battery voltage level is charged above a POR enable voltage level. The POR enable voltage level may or may not be greater than the dead battery condition voltage level. However, the POR enable voltage level is lower than the trigger voltage level. As such, the POR circuit 30 enables the reference voltage circuit 36 before the battery voltage level of the battery voltage V_bat reaches the trigger voltage level. The POR circuit 30 does this by generating a POR enable signal 38 once the battery voltage level is charged above the POR enable voltage level. In response, the reference voltage circuit 36 generates the reference voltage V_ref. When enabled, the reference voltage circuit 36 provides the reference voltage V_ref with a stable reference voltage level. Furthermore, the reference voltage V_ref has much more consistency in a population of reference voltage circuits 36, and thus the trigger voltage level can be set yielding much less variation in a population of POR devices 26.

The trigger circuit 28 is further configured to receive the reference voltage V_ref and set the trigger voltage level based on the reference voltage level. In some embodiments, the reference voltage level may be the trigger voltage level. However, in other embodiments, the trigger voltage level is simply a function of the reference voltage level of the reference voltage V_ref. Since the reference voltage level of the reference voltage V_ref is stable and relatively consistent throughout the population of POR devices 26, the trigger circuit 28 can set the trigger voltage level much more consistently. Note that the trigger circuit 28 is further operable to receive the POR enable signal 38 generated by the POR circuit 30. In this embodiment, the trigger circuit 28 remains enabled until the POR enable signal 38 is received by the trigger circuit 28.

Prior to the generation of the trigger signal 22 by the trigger circuit 28, the reference voltage circuit 36 generates the reference voltage V_ref and the trigger circuit 28 sets the trigger voltage level based on the reference voltage level. Furthermore, since the POR circuit 30 generates the POR enable signal 38 once the battery voltage level is charged above the POR enable voltage level, the reference voltage V_ref is generated in response to the battery voltage level being charged above the POR enable voltage level.

Next, when the trigger circuit 28 detects that the battery voltage level has been charged above the trigger voltage level, the trigger circuit 28 first responds by generating a bias voltage V_bias 40. The bias voltage V_bias 40 is configured to activate the eFuse sense circuit 34. In response, the eFuse sense circuit 34 senses the current voltage levels so that the voltage levels can be latched by the eFuses 32 upon activation. The trigger circuit 28 generates the bias voltage V_bias 40 for a time period in response to the battery voltage level of the battery voltage V_bat being charged above the trigger voltage level. Once the time period expires, the trigger circuit 28 responds to a detection that the battery voltage level has been charged above the trigger voltage level. More specifically, the trigger circuit 28 generates the trigger signal 22. In this embodiment, the reference voltage circuit 36 is configured to receive the trigger signal 22. In response to the trigger signal 22, the reference voltage circuit 36 is disabled. Accordingly, the trigger circuit 28 is configured to disable the reference voltage circuit 36 so that the reference voltage V_ref is not generated. This allows for the use of the reference voltage V_ref to set the trigger voltage level but also to deactivate the reference voltage circuit 36 and save power. The POR circuit 30 then switches the POR signal 24 from the deactivation state to the activation state in response to the trigger signal 22. In response to the POR signal 24 being switched to the activation state, the eFuses 32 are activated and the appropriate voltage levels are latched by the eFuses 32.

Figure 3:
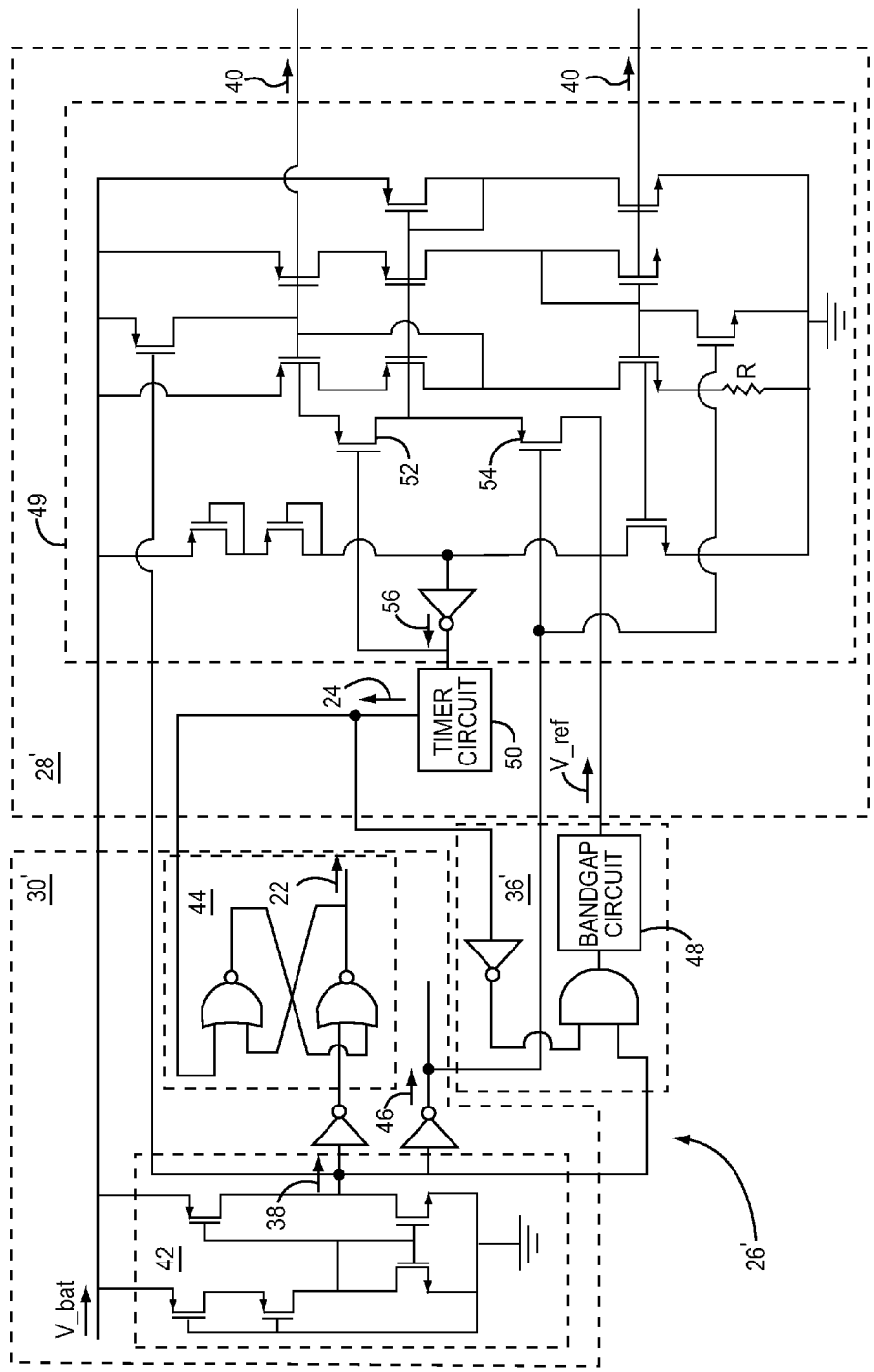
FIG. 3 illustrates a circuit diagram of the POR device illustrated in FIG. 2.

FIG. 3 illustrates a circuit diagram of a POR device 26', one embodiment of the POR device 26 shown in FIG. 2. The POR circuit 30' of the POR device 26' includes a POR enable circuit 42 and a latch 44. In this particular embodiment, the latch 44 is an SR latch. The POR enable circuit 42 is operable to receive the battery voltage V_bat and generate the POR enable signal 38. The POR enable circuit 42 can generate the POR enable signal 38 in either a disabling state or an enabling state. More specifically, while the battery voltage level is below the POR enable voltage level, the POR enable circuit 42 is configured to generate the POR enable signal 38 in the disabling state. In this embodiment, the disabling state may be considered a logical "low." However, while the battery voltage level is above the POR enable voltage level, the POR enable circuit 42 generates the POR enable signal 38 in the enabling state. The enabling state for the POR circuit 18 shown in FIG. 1 is a logical "high." An inverse of the POR enable signal 38 is received by the latch 44. Furthermore, prior to generating the trigger signal 22, the latch 44 also receives another logical "low." The latch 44 is thus configured to be opaque so as to generate the POR signal 24 in the deactivation state when the battery voltage level of the battery voltage V_bat is below the POR enable voltage level. In this example, the POR enable signal 38 is generated as a logical "high" once the battery voltage level is above the POR enable voltage level. Note also that an inverse POR enable signal 46 is also generated. As such, the reference voltage circuit 36' is enabled and generates the reference voltage V_ref. In this embodiment, the reference voltage circuit 36' includes a bandgap circuit 48. The bandgap circuit 48 may use low pass filters and feedback loop techniques to generate the reference voltage V_ref with a stable reference voltage level. The reference voltage V_ref is received by the trigger circuit 28'.

The trigger circuit 28' includes a sensing circuit 49 and a timer circuit 50. The sensing circuit 49 is activated by the POR enable signal 38, the inverse POR enable signal 46, and the reference voltage V_ref from the reference voltage circuit 36'. The sensing circuit 49 is configured to detect whether the battery voltage V_bat has been charged above the trigger voltage level. In this embodiment, a field effect transistor (FET) 52 and a FET 54 are provided as p-type FETs. The FET 52 receives a bias enable signal 56 which is generated as feedback from the output of the sensing circuit 49. Initially, the bias enable signal 56 is low and the FET 52 is set to be enabled. The FET 54 receives the inverse POR enable signal 46, which is low and thus, the FET 54 is set to be enabled. However, the FETs 52, 54 will not become enabled until the battery voltage V_bat reaches the trigger voltage level, which in this example is the reference voltage level added to a threshold voltage level of the FET 52. Once the trigger voltage level is reached by the battery voltage level of the battery voltage V_bat, the bias enable signal 56 becomes high and the FET 52 is disabled.

When the bias enable signal 56 is high, the timer circuit 50 initiates a time period. Also, the bias voltage V_bias 40, which in this example is generated as a differential voltage, is generated by the sensing circuit 49. Note that the timer circuit 50 has not yet begun to generate the trigger signal 22. Rather, as the time period is running, the sensing circuit 49 continues to generate the bias voltage V_bias 40 and thus, the eFuse sense circuit 34 (shown in FIG. 2) is activated to sense the current voltage levels. Once the time period expires, the timer circuit 50 is configured to generate the trigger signal 22 in the activation state. In this case, the activation state is considered to be a logical "high." Accordingly, the trigger signal 22 deactivates the reference voltage circuit 36' to stop the generation of the reference voltage V_ref and the sensing circuit 49 stops generating the bias voltage V_bias 40.

The trigger signal 22 is received by the latch 44 in the POR circuit 30'. Thus, the latch 44 receives a logical "low" from the POR enable circuit 42 and a logical "high" from the timer circuit 50. Accordingly, the latch 44 is configured to be transparent to the trigger signal 22 once the POR enable signal 38 is in the enabling state and the trigger signal 22 is in the activation state. As such, the POR signal 24 is switched from the deactivation state to the activation state provided by the trigger signal 22. So long as the trigger signal 22 is being provided by the timer circuit 50, the latch 44 holds the POR signal 24 in the activation state. Accordingly, the eFuses 32 are activated. In this embodiment, the timer circuit 50 is configured to remain active and continuously generate the trigger signal 22 once the time period expires. As a result, the latch 44 holds the POR signal 24 in the activation state. As a result, the reference voltage circuit 36' remains disabled so that the reference voltage V_ref is not generated. The POR enable circuit 42 also continues to generate the POR enable signal 38 in the enabling state as long as the battery voltage V_bat is above the POR enable voltage level.

Figure 4A:
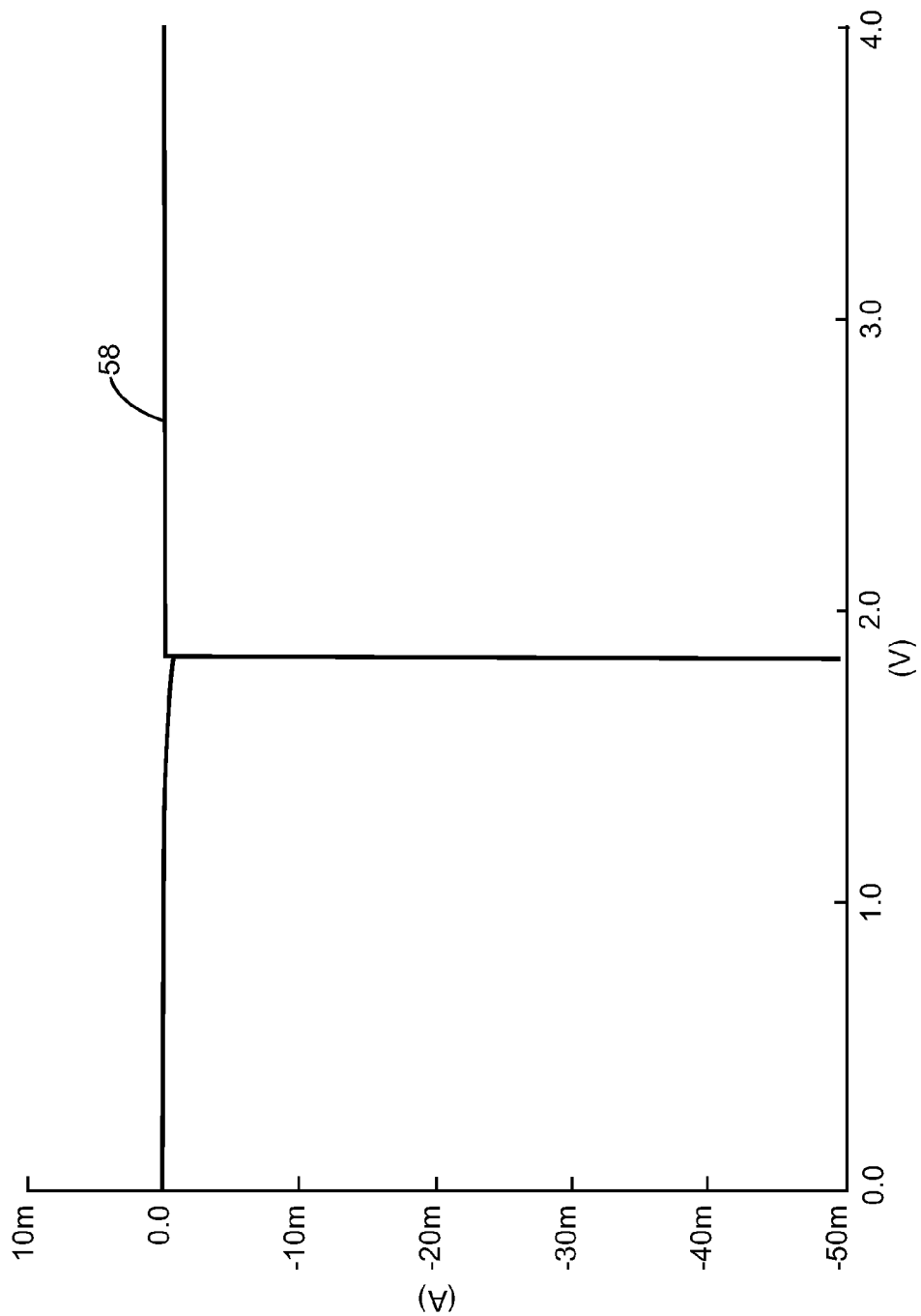
FIG. 4A illustrates a graph of a current level of a current drawn by an eFuse sense circuit, shown in FIG. 2, as a function of a battery voltage.

FIG. 4A illustrates the current voltage level of a current 58 drawn by the eFuse sense circuit 34 (shown in FIG. 2) in response to activation by the bias voltage V_bias 40. As explained above, this occurs when the battery voltage level is above the trigger voltage level, and thus above the dead battery condition voltage level. In this case, the eFuse sense circuit 34 is activated to sense the current levels. Upon the expiration of the time period, the timer circuit 50 deactivates the bias voltage V_bias 40 and as a result, the eFuse sense circuit 34 no longer draws the current 58.

Figure 4B:
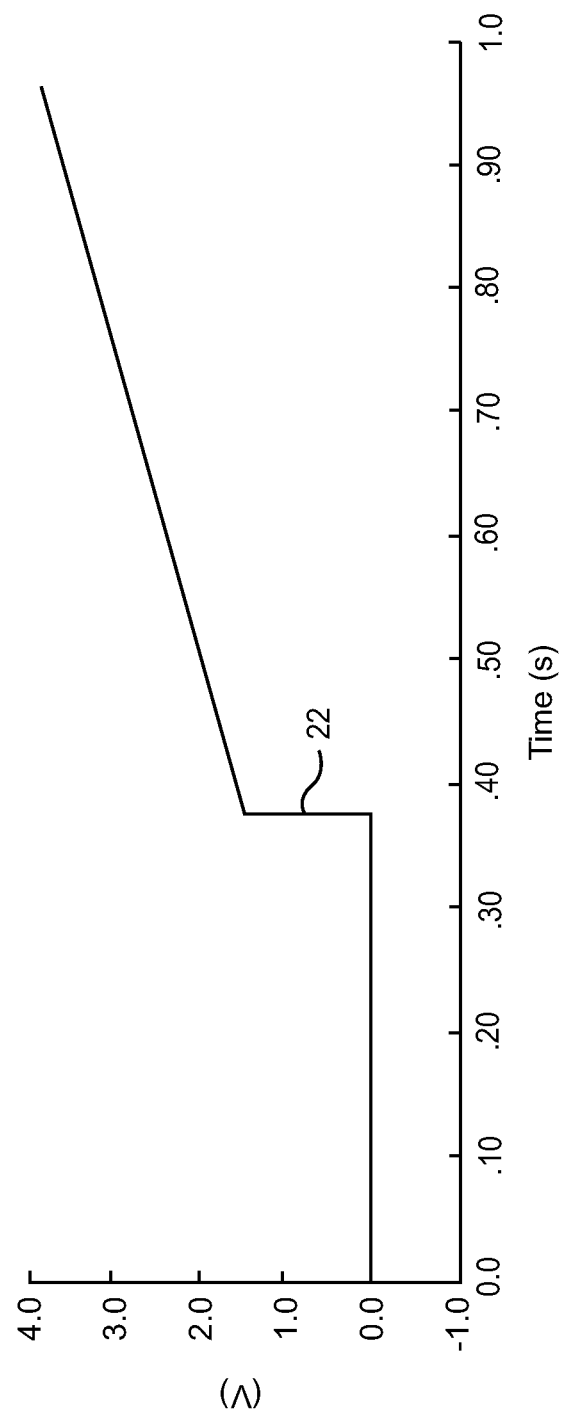
FIG. 4B illustrates a graph of a voltage level of a POR signal that activates the eFuses shown in FIG. 2 as a function of a battery voltage.

However, as shown in FIG. 4B, the latch 44 generates the POR signal 24 in the activation state once the time period expires. In other words, the latch 44 switches the POR signal 24 from the deactivation state to the activation state once the timer circuit 50 generates the trigger signal 22. In this embodiment, the latch 44 continues to generate the POR signal 24 in the activation state as long as the timer circuit 50 provides the trigger signal 22.

Those skilled in the art will recognize improvements and modifications to the preferred embodiments of the present disclosure. All such improvements and modifications are considered within the scope of the concepts disclosed herein and the claims that follow.

What is claimed is:

1. A power-on-reset (POR) device for activation of a circuit block, comprising:
   a POR circuit configured to receive an active trigger signal, configured to generate a POR signal, and configured to switch the POR signal from a deactivation state to an activation state in response to receiving the active trigger signal;
   a trigger circuit configured to receive a battery voltage, and configured to generate the active trigger signal in response to the battery voltage being greater than a dead battery condition voltage level.

2. The POR device of claim 1, wherein the POR circuit is configured to generate the POR signal so that the POR signal is configured to:
   activate the circuit block when the POR signal is in the activation state; and
   deactivate the circuit block when the POR signal is in the deactivation state.

3. The POR device of claim 2, wherein the POR circuit is coupled to the circuit block so that the circuit block receives the POR signal.

4. The POR device of claim 3, wherein a battery that powers the circuit block comprises a lithium-ion battery.

5. The POR device of claim 1, wherein:
   the POR circuit is coupled to the circuit block so that the circuit block receives the POR signal, wherein the circuit block comprises one or more eFuses; and
   the POR circuit is configured to generate the POR signal so that the POR signal is configured to activate the one or more eFuses when the POR signal is in the activation state.

6. The POR device of claim 1, further comprising:
   a reference voltage circuit configured to be enabled and disabled, wherein the reference voltage circuit is configured to generate a reference voltage having a reference voltage level when enabled and to not generate the reference voltage when disabled;
   the trigger circuit being further configured to receive the reference voltage and set a trigger voltage level based on the reference voltage level.

7. The POR device of claim 6, wherein the POR circuit is further configured to receive the battery voltage and enable the reference voltage circuit once the battery voltage is above a POR enable voltage level, wherein the POR enable voltage level is lower than the trigger voltage level.

8. The POR device of claim 7, wherein the trigger circuit is further configured to deactivate the reference voltage circuit in response to the battery voltage being above the trigger voltage level.

9. The POR device of claim 1, wherein the trigger circuit comprises:
 a timer circuit configured to be activated such that the timer circuit is configured to generate a trigger signal once a time period expires, wherein the time period begins once the timer circuit is activated;
 a sensing circuit configured to:
  detect whether the battery voltage has been charged above a trigger voltage level; and
  activate the timer circuit once the battery voltage is above the trigger voltage level.

10. The POR device of claim 9, wherein the sensing circuit is further configured to generate a bias voltage in response to the battery voltage being above the trigger voltage level.

11. The POR device of claim 10, wherein the bias voltage is configured to activate an eFuse sense circuit.

12. The POR device of claim 10, wherein the timer circuit is further configured to stop the sensing circuit from generating the bias voltage once the time period expires.

13. The POR device of claim 9, wherein:
 the timer circuit is further configured to generate the trigger signal so that the trigger signal is in the activation state;
 the POR circuit comprises:
  a POR enable circuit configured to receive the battery voltage and generate a POR enable signal in a disabling state and in an enabling state, wherein the POR enable circuit is configured to generate the POR enable signal in the disabling state while the battery voltage level is below a POR enable voltage level and in the enabling state while the battery voltage level is above the POR enable voltage level, wherein the POR enable voltage level is lower than the trigger voltage level;
  a latch configured to receive the trigger signal, receive the POR enable signal, and generate the POR signal, wherein the latch is configured to be opaque so as to generate the POR signal in the deactivation state while the POR enable signal is in the disabling state, be transparent to the trigger signal once the POR enable signal is in the enabling state so that the POR signal is switched from the deactivation state to the activation state provided by the trigger signal, and hold the POR signal in the activation state so long as the trigger signal is provided.

14. A method of activating a circuit block, comprising:
 receiving a battery voltage;
 generating a power-on-reset (POR) signal, wherein the POR signal is initially in a deactivation state;
 generating an active trigger signal in response to the battery voltage being above a dead battery condition voltage level; and
 while generating the POR signal, switching the POR signal from the deactivation state to an activation state in response to the active trigger signal.

15. The method of claim 14, wherein the POR signal is configured to activate the circuit block when the POR signal is in the activation state and the POR signal is further configured so that the circuit block is not activated when the POR signal is in in the deactivation state.

16. The method of claim 15, further comprising:
 transmitting the POR signal to the circuit block.

17. The method of claim 14, wherein a battery that powers the circuit block comprises a lithium-ion battery.

18. The method of claim 14, wherein the circuit block comprises one or more eFuses and the POR signal is configured to activate the one or more eFuses when the POR signal is in the activation state.

19. The method of claim 14, further comprising:
 prior to generating the active trigger signal, generating a reference voltage having a reference voltage level; and
 prior to generating the active trigger signal, setting a trigger voltage level based on the reference voltage level.

20. The method of claim 19, wherein generating the reference voltage having the reference voltage level is in response to the battery voltage being above a POR enable voltage level, wherein the POR enable voltage level is below the trigger voltage level.

21. The method of claim 14, further comprising:
 prior to generating the active trigger signal, detecting whether the battery voltage is above a trigger voltage level; and
 wherein generating the active trigger signal in response to detecting that the battery voltage being above the trigger voltage level comprises generating the active trigger signal once a time period expires, wherein the time period is initiated as a result of detecting that the battery voltage being above the trigger voltage level.

22. The method of claim 21, further comprising:
 generating a bias voltage for the time period in response to the battery voltage being above the trigger voltage level.

23. The method of claim 22, wherein the bias voltage is configured to activate an eFuse sense circuit.

24. The method of claim 21, wherein the active trigger signal is generated so that the active trigger signal is in the activation state.

25. The method of claim 24, further comprising:
 generating a POR enable signal in a disabling state while the battery voltage is below a POR enable voltage level, wherein the POR enable voltage level is lower than the trigger voltage level;
 wherein generating the POR signal comprises generating the POR signal in the deactivation state while the POR enable signal is in the disabling state;
 generating the POR enable signal in an enabling state while the battery voltage is above the POR enable voltage level;
 wherein switching the POR signal comprises switching the POR signal once the POR enable signal is in the enabling state so that the POR signal is switched from the deactivation state to the activation state; and
 holding the POR signal in the activation state so long as the active trigger signal is provided in the activation state.

* * * * *